US009240389B2

(12) United States Patent
Di Cioccio et al.

(10) Patent No.: US 9,240,389 B2
(45) Date of Patent: Jan. 19, 2016

(54) METHOD FOR PRODUCING AT LEAST ONE PAD ASSEMBLY ON A SUPPORT FOR THE SELF-ASSEMBLY OF AN INTEGRATED CIRCUIT CHIP ON THE SUPPORT BY THE FORMATION OF A FLUORINATED MATERIAL SURROUNDING THE PAD AND EXPOSURE OF THE PAD AND THE FLUORINATED MATERIAL TO AN ULTRAVIOLET TREATMENT IN THE PRESENCE OF OZONE

(71) Applicants: Commissariat A L'Energie Atomique Et Aux Energies Alternatives, Paris (FR); STMICROELECTRONICS (CROLLES 2) SAS, Crolles (FR)

(72) Inventors: Léa Di Cioccio, Saint Ismier (FR); Sébastien Mermoz, Meylan (FR); Loïc Sanchez, Voiron (FR)

(73) Assignees: COMMISSARIAT A L'ENERGIE ATOMIQUE ET AUX ENERGIES ALTERNATIVES, Paris (FR); STMICROELECTRONICS (CROLLES2) SAS, Crolles (FR)

( * ) Notice: Subject to any disclaimer, the term of this patent is extended or adjusted under 35 U.S.C. 154(b) by 0 days.

(21) Appl. No.: 14/438,668

(22) PCT Filed: Mar. 20, 2013

(86) PCT No.: PCT/FR2013/050598
§ 371 (c)(1),
(2) Date: Apr. 27, 2015

(87) PCT Pub. No.: WO2013/140094
PCT Pub. Date: Sep. 26, 2013

(65) Prior Publication Data
US 2015/0287695 A1    Oct. 8, 2015

(30) Foreign Application Priority Data

Mar. 22, 2012 (FR) ...................................... 12 52577

(51) Int. Cl.
*H01L 21/00* (2006.01)
*H01L 23/00* (2006.01)
(Continued)

(52) U.S. Cl.
CPC .............. *H01L 24/83* (2013.01); *H01L 21/311* (2013.01); *H01L 23/147* (2013.01)

(58) Field of Classification Search
CPC ... H01L 27/14685; H01L 35/34; H01L 51/56; H01L 31/18; H01L 51/0003; C12N 2535/10
USPC .................................. 438/106, 118, 125, 758
See application file for complete search history.

(56) References Cited

U.S. PATENT DOCUMENTS

| 8,216,680 | B2 * | 7/2012 | Hsu | ......................... | H01B 1/08 428/421 |
| 2005/0089803 | A1 * | 4/2005 | Bouaidat | ............. | C12N 5/0068 430/312 |

(Continued)

FOREIGN PATENT DOCUMENTS

| DE | 102009050426 B3 | 3/2011 |
| EP | 1478016 A2 | 11/2004 |

(Continued)

OTHER PUBLICATIONS

English Translation of the Written Opinion of the International Searching Authority relative to PCT/FR2013/050598, 17 pages.

(Continued)

*Primary Examiner* — Sheila V. Clark
(74) *Attorney, Agent, or Firm* — Vedder Price, P.C.

(57) ABSTRACT

A method for producing at least one pad assembly (32, 50) on a support (19, 43) for use in a method for self-assembling at least one element (10) on the support (19, 43), comprises fanning, on the support (19, 43), a layer (28, 48) of at least one fluorinated material around the location (30, 44) of the pad assembly (32, 50), the layer (28, 48) having a thickness greater than 10 nm. The layer (28, 48) and the location (30, 44) are exposed to an ultraviolet treatment in the presence of ozone to form the pad assembly (32, 50) at said location (30, 44), wherein a drop of liquid (16) having a static contact angle on the pad assembly (32, 50) less than or equal to 15°, after the exposure to the ultraviolet treatment, has a static contact angle on the layer (28, 48) greater than or equal to 100°.

16 Claims, 3 Drawing Sheets

(51) Int. Cl.
*H01L 21/311* (2006.01)
*H01L 23/14* (2006.01)

(56) References Cited

U.S. PATENT DOCUMENTS

| 2009/0071706 | A1* | 3/2009 | Shintate | H05K 3/4664 174/262 |
|---|---|---|---|---|
| 2009/0265929 | A1 | 10/2009 | Nakagawa et al. | |
| 2010/0073452 | A1 | 3/2010 | Nakagawa et al. | |
| 2013/0248848 | A1* | 9/2013 | Radu | H01L 51/0018 257/40 |
| 2014/0349431 | A1* | 11/2014 | Fennimore | H01L 51/56 438/46 |

FOREIGN PATENT DOCUMENTS

| JP | 2005-014141 | 1/2005 |
|---|---|---|
| WO | 03083960 A1 | 10/2003 |

OTHER PUBLICATIONS

International Search Report relative to PCT/FR2013/050598, dated May 23, 2013, 4 pages.

"Surface Tension-Powered Self-Assembly of Microstructures—The State-of-the-Art; R. Syms, E. Yeatman, V. Bright and G. Whitesides; Journal of Microelectromechanical Systems", vol. 12, No. 4, Aug. 2003; 31 pages.

"Silver InkJet Printing With Control of Surface Energy and Substrate Temperature"; S-H Lee, K-Y Shin, J Y Hwang, K T Kang and H S Kang; Journal of Micromechanices and Microengineering; 8 pages.

"Fluidic Self-Alignment Applied to a Micro-Fluidic System"; A. Debray, Y A Chapuis, M. Shibata and H, Fujita; IEICE Electronics Express, vol. 3, No. 11 227-232, 6 pages.

"Selective Plasma-Induced Deposition of Fluorocarbon Films on Metal Surfaces for Actuation in Microfluidics"; P. Bayiati, A. Tserepi, E. Gogolides and K. Misiakos; J. Vac. Sci Technol, A 22(4), Jul./Aug. 2004; 6 pages.

"The Property of Plasma-Polymerized Fluorocarbon Film in Relation to CH4/C4F8 Ration and Substrate Temperature"; Y. Matsumoto and M. Ishida; Sensors and Actuators 83 (2000); 8 pages.

"Environmental Effects on Droplet Self-Alignment Assisted Hybrid Microassembly"; M. Jääskeläinen, V. Sariola and Q. Zhou; Proceedings of 2009 IEEE International Symposium on Assembly and Manufacturing Nov. 17-20, 2009, Suwon, Korea; 6 pages.

"Self-Alingment In the Stacking of Microchips with Mist-Induced Water Droplets"; B.Chang, V. Sariola, M. Jääskeläinen, Q. Zhou; Journal of Micromechanics and Microengineering, published Dec. 21, 2010; 12 pages.

"Surface Molecular Property Modifications for Poly (Dimethylsiloxane) (PDMS) Based Microfluidic Devices"; I. Wong and C M Ho; National Institute of Health, published Sep. 1, 2009; 29 pages.

"Thin Teflon-Like Films for Eliminating Adhesion in Released Polysilicon Microstructures"; B. Smith, J. Sniegowski, G. La Vigne and C. Brown; 6 pages.

"New Three-Dimensional Integration Technology Using Chip-to-Wafer Bonding to Achieve Ultimate Super-Chip Integration"; T. Fukushima, Y. Yamada, H. Kikuchi and M. Koyanagi; Japanese Journal of Applied Physics, vol. 45, No. 4B, 2006, pp. 3030-3035; 6 pages.

"Development of a New Self-Assembled Die Bonder to Three-Dimensionally Stack Known Good Dies in Batch"; T. Fukushima, E. Iwata, T. Tanaka and M. Koyanagi; Department of Bioengineering and Robotics, Graduate School of Engineering; 4 pages.

"New Three-Dimensional Integration Technology Based on Reconfigured Wafer-on-Wafer Bonding Technique"; T. Fukushima, H. Kikuchi, Y. Yamada, T. Konno, J. Liang, K. Sasaki, K. Inamura, T. Tanaka and M. Koyanagi; Department of Bioengineering and Robotics, Graduate School of Engineering; 4 pages.

"Surface Tension-Drive Chip Self-Assembly With Load-Free Hydrogen Fluoride-Assisted Direct Bonding at Room Temperature for Three-Dimensional Integrated Circuits"; T. Fukushima, E. Iwata, T. Konno, J. C. Bea, K.W. Lee, T. Tanaka and M. Koyanagi; American Institute of Physics; 3 pages.

"Self-Assembly Technologies with High-Precision Chip Alignment and Fine-Pitch Microbump Bonding for Advanced Die-to-Wafer 3D Integration"; T. Fukushima, Y. Ohara, M. Murugesan, J.C. Bea, K. W. Lee, T. Tanaka and M. Koyanagi; 2011 Electronic Components and Technology Conference; 6 pages.

"Self-Assembly of Chip-Size Components with Cavity Structures: High-Precision Alignment and Direct Bonding Without Thermal Compression for Hetero Integration"; T. Fukushima, T. Konno, E. Iwata, R. Kobayashi, T. Kojima, M. Murugesan, J-C. Bea, K-W. Lee, T. Tanaka and M. Koyanagi; Micromachines 2011; 20 pages.

"Evaluation of Alignment Accuracy on Chip-to-Wafer Self-Assembly and Mechanism on the Direct Chip Bonding at Room Temperature"; T. Fukushima, E. Iwata, J. Bea, M. Murugesan, K-W. Lee, T. Tanaka and M. Koyanagi; 5 pages.

"Self-Alignment of Microchips Using Surface Tension and Solid Edge"; C. G. Tsai, C. M. Hsieh and J. A. Yeh; ScienceDirect; 7 pages.

"Three Dimensional Hybrid Microassembly Combining Robotic Microhandling and Self-Assembly"; V. Sariola, Q. Zhou and H. Koivo; 2009 IEEE International Conference on Robotics and Automation; 6 pages.

"Hybrid Microassembly Combining Robotics and Water Droplet Self-Alignment"; V. Sariola, M. Jääskeläinen, Q. Zhou; IEEE Transactions on Robotics, Vo. 26, No. 6, Dec. 2010; 13 pages.

"Microassembly Combining Pick-and-Place and Water Mist"; B. Chang, M. Jääskeläinen, Q. Zhou; Department of Automation and System Technology; 5 pages.

* cited by examiner

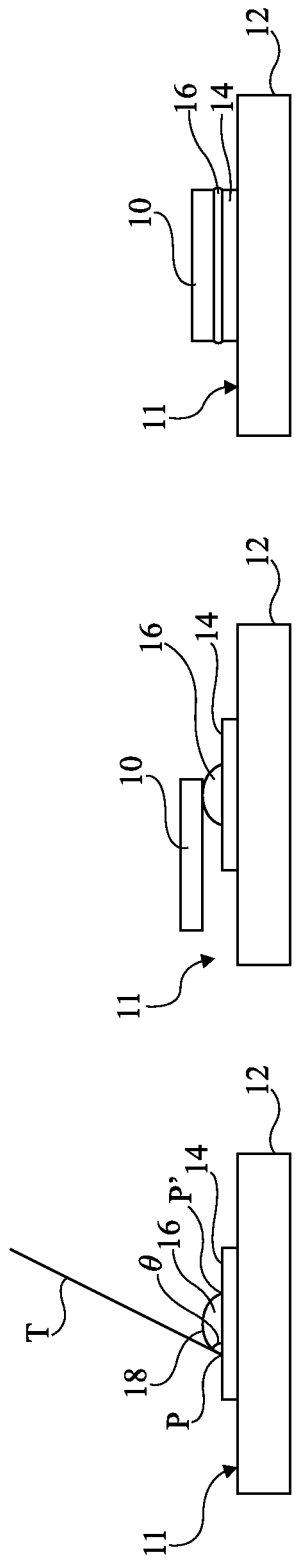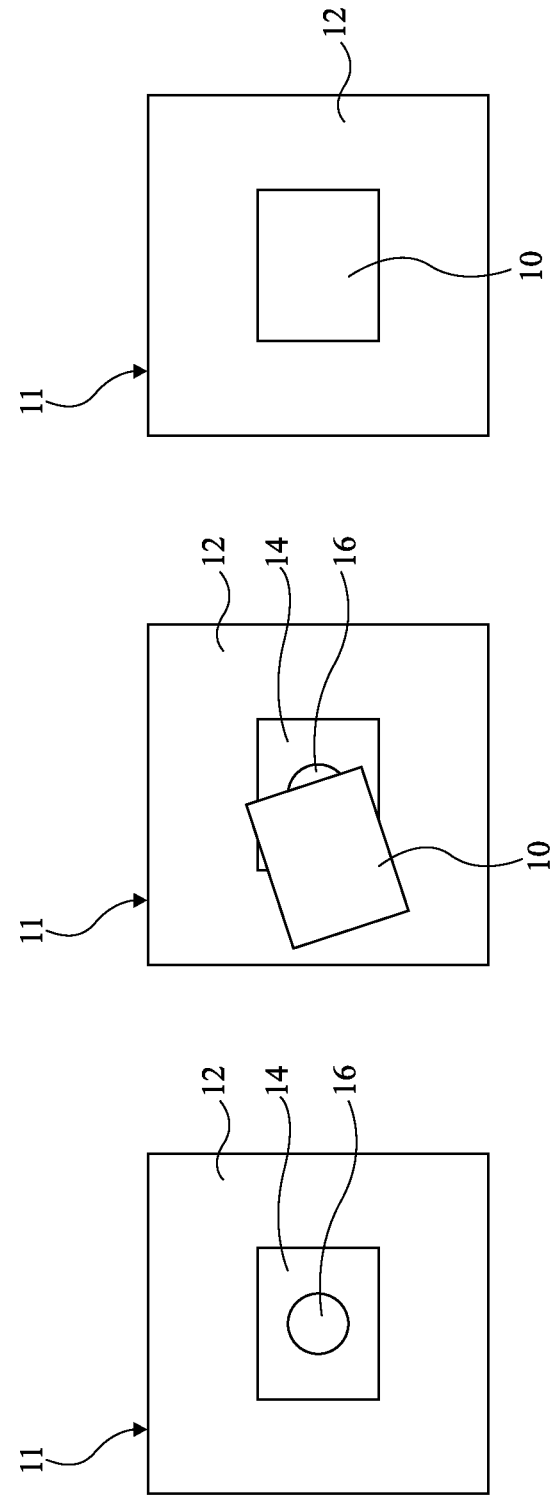

METHOD FOR PRODUCING AT LEAST ONE PAD ASSEMBLY ON A SUPPORT FOR THE SELF-ASSEMBLY OF AN INTEGRATED CIRCUIT CHIP ON THE SUPPORT BY THE FORMATION OF A FLUORINATED MATERIAL SURROUNDING THE PAD AND EXPOSURE OF THE PAD AND THE FLUORINATED MATERIAL TO AN ULTRAVIOLET TREATMENT IN THE PRESENCE OF OZONE

TECHNICAL FIELD

The present disclosure relates to a method for manufacturing pads on a support for the implementation of a method of self-assembly of an electronic circuit on the support.

DISCUSSION OF THE ART

For certain applications, one or several electronic circuits, for example, integrated circuits, are bonded to a support. The support for example corresponds to another integrated circuit. The bonding is for example performed by molecular bonding or by thermocompression.

Before bonding the integrated circuit to the support, it is necessary to properly arrange the integrated circuit with respect to the support. This may be done by a method of self-assembly of the integrated circuit on the support.

FIGS. 1A to 1C are partial simplified cross-section views of the structures obtained at successive steps of an example of a method of self-assembly of an integrated circuit 10 on a support 11 and FIGS. 2A to 2C are respective cross-section views of the structures shown in FIGS. 1A to 1C.

Support 11 comprises a substrate 12 of a material of low wettability, for example, silicon, and comprises, at the surface of substrate 12, a pad 14 of a material of high wettability. Support 11 may comprise several pads 14. A drop 16 of a liquid, for example, demineralized water, is placed on pad 14 (FIGS. 1A and 2A). Pad 14 may be obtained by forming a silicon oxide layer on substrate 12 and by etching the obtained layer to delimit pad 14. The silicon oxide layer may have a thickness on the order of 50 nm.

Generally, the wettability of a material may be characterized by angle θ of contact of a liquid drop on the material. The smaller the contact angle, the higher the wettability of the material. In the cross-section plane of FIG. 1A, liquid/air interface 18 of drop 16 is in contact with pad 14 at contact points P and P'. Call T the tangent to interface 18 at contact point P (or P'). Angle θ of contact of drop 16 on pad 14 is the angle between tangent T and the surface of pad 14, the surface of pad 14 being horizontal. When drop 16 is at rest, the measured angle θ is the static contact angle.

Electronic circuit 10 is then brought towards pad 14 until it comes in contact with drop 16. During this approach phase, integrated circuit 10 may be shifted and inclined with respect to pad 14 (FIGS. 1B and 2B).

The forces exerted by drop 16 on integrated circuit 10 then displace integrated circuit 10 until it is in the desired alignment with respect to pad 14 (FIGS. 1C and 2C), without for any external action to be necessary.

The bonding of integrated circuit 10 to support 11, for example, by molecular bonding or by thermocompression, can then be implemented.

For the self-assembly method to take place properly, drop 16 must remain confined on pad 14 all along the alignment of integrated circuit 10 with respect to support 11. In the previously-described self-assembly method, the confinement of drop 16 on pad 14 all along the self-assembly is obtained by the difference in wettability between pad 14 and substrate 12. The greater the wettability difference, the more drop 16 tends to remain confined on pad 14.

However, with known methods, it may be difficult to obtain a significant wettability difference between pad 14 and substrate 12. There may then be a misplacement of drop 16 on support 11 and drop 16 may leave pad 14 during the self-assembly.

There thus is a need to form self-assembly pads enabling to improve the confinement of liquid drops on a support for the implementation of a self-assembly method.

It is further desirable for the pad manufacturing method to be compatible with conventional electronic circuit manufacturing techniques.

BRIEF SUMMARY

An object of the present invention is to overcome all or part of the disadvantages of known pad manufacturing methods.

Another object of the present invention is to improve the confinement of liquid drops on pads of a support for the implementation of a self-assembly method.

Another object of the present invention is to improve the wettability difference between the pad and the substrate surrounding the pad, for the implementation of a self-assembly method.

Another object of the present invention is for the pad manufacturing method to be compatible with conventional integrated circuit manufacturing methods.

An embodiment of the present invention provides a method for manufacturing at least one assembly pad on a support intended for the implementation of a method of self-assembly of at least one element on the support, the manufacturing method comprising the successive steps of:
  (a) forming, on the support, a layer of at least one fluorinated material around the location of the assembly pad; and
  (b) submitting the layer and the location to an ultraviolet processing in the presence of ozone to form the assembly pad at said location.

According to an embodiment, the fluorinated material is a fluorocarbon material.

According to an embodiment, step (a) comprises exposing the support to a plasma based on octafluorobutene, hexafluoroethane, carbon tetrafluoride, and/or trifluoromethane.

According to an embodiment, the method further comprises the steps of:
  (c) forming a resin portion on the support at said location before step (a); and
  (d) removing the resin portion before step (b).

According to an embodiment, the method further comprises, after step (c) and before step (a), a step of etching the support to form a protrusion under the resin portion.

According to an embodiment, the support comprises a semiconductor material substrate having the fluorinated material layer formed thereon, the method further comprising a step of forming an oxide layer of the semiconductor material on the substrate before step (a).

According to an embodiment, the method further comprises the steps of:
  (e) depositing a drop of a liquid on the assembly pad; and
  (f) bringing the element in contact with the drop, whereby the element is self-assembled with respect to the support.

According to an embodiment, the element is an integrated circuit chip.

According to an embodiment, the method further comprises the steps of:
(g) drying the drop; and
(h) bonding the element to the support.

According to an embodiment, step (h) comprises a step of molecular bonding of the element to the assembly pad.

An embodiment of the present invention also provides a support intended for the implementation of a method of self-assembly of at least one element on the support, comprising:
at least one assembly pad, a liquid drop having a static contact angle on the assembly pad smaller than or equal to 15°; and
a drop of at least one fluorinated material around the assembly pad, the liquid drop having a static contact angle on the layer greater than or equal to 100°.

According to an embodiment, the liquid drop has a static contact angle on the assembly pad smaller than or equal to 10° and has a static contact angle on the layer greater than or equal to 110°.

According to an embodiment, the material is a fluorocarbon material.

According to an embodiment, the support further comprises a protrusion comprising sides and a top, the assembly pad being on the top and the layer covering the sides.

According to an embodiment, the sides are inclined by more than 45° with respect to the top.

According to an embodiment, the support further comprises a substrate, the assembly pad and the layer being formed on the substrate, the substrate being made of a semiconductor material, the assembly pad comprising an oxide of the semiconductor material.

BRIEF DESCRIPTION OF THE DRAWINGS

The foregoing and other features and advantages will be discussed in detail in the following non-limiting description of specific embodiments in connection with the accompanying drawings, among which:

FIGS. 1A to 1C, previously described, are cross-section views of structures obtained at successive steps of an example of a self-assembly method;

FIGS. 2A to 2C, previously described, are respective top views of FIGS. 1A to 1C;

For clarity, the same elements have been designated with the same reference numerals in the different drawings and, further, as usual in the representation of integrated circuits, the various drawings are not to scale.

DETAILED DESCRIPTION

According to the present invention, the pads intended for the implementation of a self-assembly method are made of a material of high wettability, for which the static contact angle of a liquid drop on the material is smaller than or equal to 15°, preferably smaller than or equal to 10°, and preferably still smaller than or equal to 5°. Each pad is surrounded with a region of a material of low wettability, for which the static contact angle is greater than or equal to 100°, preferably greater than or equal to 110°, and preferably still greater than or equal to 115°.

According to the present invention, the pads of high wettability are formed after the regions of low wettability surrounding the pads. The method for manufacturing regions of low wettability thus causes no decrease in the wettability of the pads of high wettability. The high wettability of the pads is obtained by a processing under an ultraviolet radiation in the presence of ozone. For the method for manufacturing pads of high wettability not to increase the wettability of the regions of low wettability which have already been formed, the regions of low wettability are made by the forming of a layer of a fluorinated material, preferably a fluorocarbon material. Indeed, the present inventors have shown that the layer of the fluorinated material, preferably a fluorocarbon material, keeps a low wettability even after having been applied the ultraviolet radiation processing in the presence of ozone while such a processing generally increases the wettability of the surfaces to which it is applied.

FIGS. 3A to 3E show the structures obtained at successive steps of a first embodiment of a method according to the present invention for manufacturing pads on a support intended for the implementation of a self-assembly method. A single pad is shown in FIGS. 3A to 3E. It should be clear that the first embodiment of the manufacturing method according to the present invention can be implemented to simultaneously form several pads.

Figure 3A:
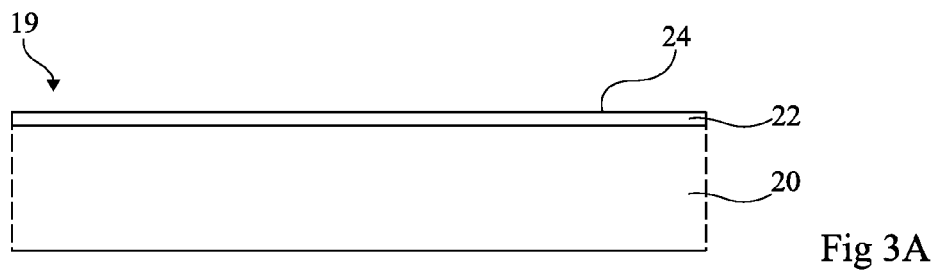
FIGS. 3A to 3E are partial simplified cross-section views of the structures obtained at successive steps of a first embodiment of a method for manufacturing according to the present invention a pad intended for the implementation of a self-assembly method.

FIG. 3A shows a support 19 comprising a substrate 20 covered with an insulating layer 22. Substrate 20 may be a substrate of a semiconductor material, for example, silicon. Insulating layer 22 may then be a silicon oxide layer. The thickness of silicon oxide layer 22 may range between 5 nm and 200 nm, for example being on the order of 50 nm. The free surface of layer 22 is designated with reference numeral 24.

Figure 3B:
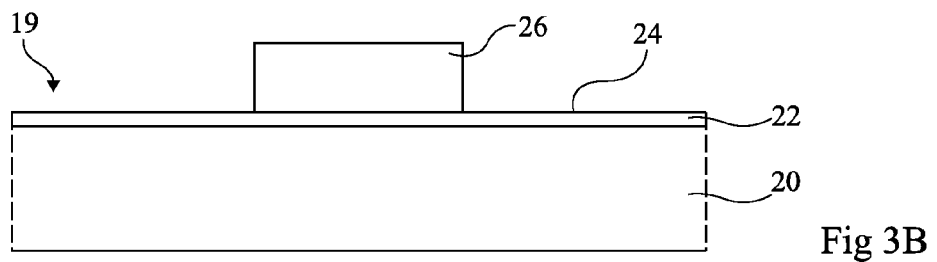

FIG. 3B shows the structure obtained after the deposition of a portion 26 of a resist on surface 24. As an example, the thickness of resist portion 26 may range between 500 nm and 3 µm, for example being on the order of 2.5 µm. Silicon oxide layer 22 especially eases the bonding of the resin. The deposition of resin portion 26 may be performed by conventional photo-lithography steps comprising:
depositing a resin layer all over surface 24;
exposing the resin layer to a radiation through a mask to reproduce in the resist layer patterns of the mask defining the contour of portion 26; and
dissolving a portion of the resin layer to delimit portion 26.

The resin may be a "positive" resist. The resist portion exposed to the radiation then becomes soluble in a specific aqueous or organic solution, called development solution, and the resist portion which has not been exposed remains non-soluble in the development solution. The resin may be a "negative" resist. The resist portion exposed to the radiation then becomes non-soluble in the development solution, and the resist portion which has not been exposed remains soluble in the development solution.

Examples of resin comprise the following compounds:
phenol formaldehyde, for example, a mixture of diazonaphtoquinone (or DNQ) and of a novolak resin (phenol formaldehyde resin);
polyhydroxystyrene;
poly(methyl methacrylate) or PMMA;
poly(methyl glutarimide) or PMGI; and epoxy-based polymer (for example, resin sold under trade name SU-8 by Micochem company).

Figure 3C:
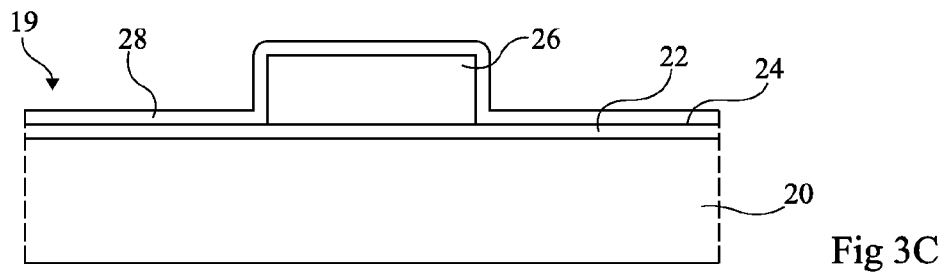

FIG. 3C shows the structure obtained after the deposition of a layer 28 of low wettability over the entire structure shown in FIG. 3B, that is, over resin portion 26 and the portions of silicon oxide layer 22 which are not covered with resin portion 26. Advantageously, the deposition is conformal. The thickness of layer 28 for example ranges between 10 nm and 300 nm. Layer 28 is based on fluorinated compounds. Preferably, layer 28 is based on fluorocarbon compounds. As an example, layer 28 is based on fluorocarbon compounds of $C_xF_y$ type, where x and y are real numbers, with x ranging from 1 to 5 and y ranging from 1 to 8.

The deposition of layer 28 may be performed by placing the structure shown in FIG. 3B in a passivation plasma formed of octafluorobutene ($C_4F_8$), hexafluoroethane ($C_2F_6$), carbon tetrafluoride ($CF_4$), and/or trifluoromethane ($CHF_3$). The time of exposure of the structure shown in FIG. 3B to the plasma may range from 3 to 30 seconds.

As an example, $C_4F_8$, $C_2F_6$, $CF_4$, and/or $CHF_3$ gases may be introduced into a reactor chamber. A plasma is then formed at ambient temperature, for example, at approximately 20° C., by application of an adapted radio frequency current to the chamber. The pressure in the reactor chamber for example ranges from 10 to 100 Pa. The plasma based on $C_4F_8$, $C_2F_6$, $CF_4$, and/or $CHF_3$ gas may be formed in an inductively-coupled plasma or ICP reactor with a radio frequency generator.

The obtained layer has a low wettability. The static contact angle is greater than or equal to 110°, preferably greater than or equal to 115°.

The wettability angle may be measured by means of the measurement device sold by GBX under trade name Digidrop—MCAT. The measurement comprises depositing a drop of demineralized water, from 2 to 10 μl, on a surface of the material to be examined, acquiring an image of the drop by means of an image acquisition device, and determining the contact angle by computer analysis of the acquired image.

Figure 3D:
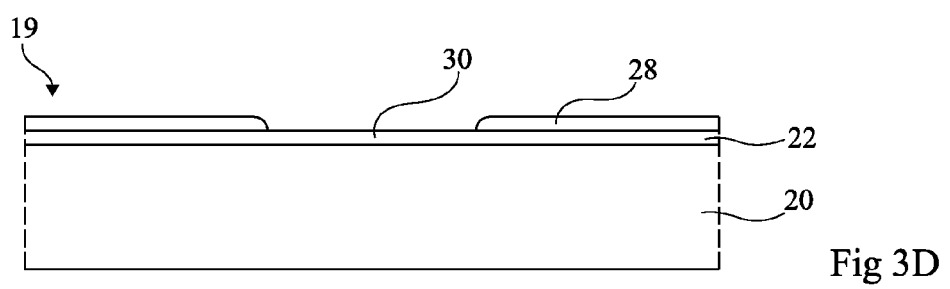

FIG. 3D shows the structure obtained after removal of resin portion 26 to expose the portion 30 of silicon oxide layer 22 which was covered with resin portion 26. The removal step may be carried out by placing the structure obtained at step 3C in a bath of a solvent capable of dissolving the resin. The processing time in the bath for example ranges from 40 seconds to 1 minute. The solvent for example is acetone or N-methyl-2-pyrrolidone. Advantageously, ultrasounds are applied to support 19 while it is dipped in the bath. As an example, the wavelength of the ultrasounds ranges between 45 kHz and 47 kHz.

Figure 3E:
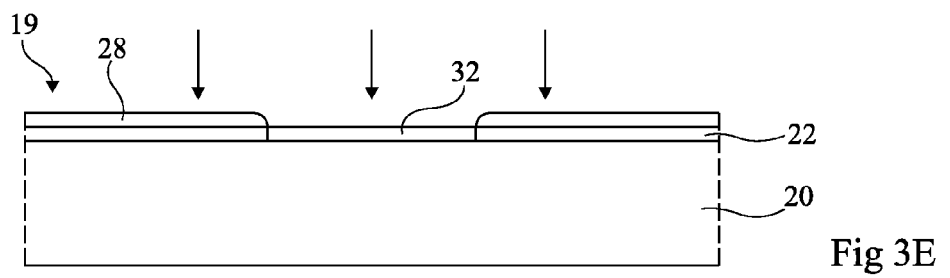

FIG. 3E shows the structure obtained after a processing causing an increase in the wettability of the exposed portion 30 to form a pad 32 of high wettability intended for the implementation of a self-assembly method. The processing comprises exposing the entire structure shown in FIG. 3C to an ultraviolet radiation in the presence of ozone. The ultraviolet radiation comprises a first ultraviolet radiation at a first wavelength ranging between 182 nm and 187 nm, for example, on the order of 184.9 nm, and a second ultraviolet radiation at a second wavelength ranging between 250 nm and 255 nm, for example, on the order of 253.7 nm. The first radiation especially enables to alter the hydrocarbon compounds present on portion 30. The second radiation especially enables to form active radicals from ozone, such active radicals reacting with the hydrocarbon compounds to form volatile compounds which are evacuated. The processing may be implemented at a temperature on the order of 80° C. in an enclosure initially containing ozone. This UV processing may be performed at the atmospheric pressure.

The contact angle of a liquid drop, for example, demineralized water, on pad 32 is smaller than or equal to 15°, preferably smaller than or equal to 10°, and preferably still smaller than or equal to 5°, while the contact angle of a liquid drop, for example, demineralized water, on portion 30 before the ultraviolet radiation processing in the presence of ozone ranges between 20° and 30°. The wettability difference between portion 32 and adjacent layer 28 is thus greater than or equal to 85°, preferably greater than or equal to 90°, and preferably still greater than or equal to 100°, which provides a proper confinement of a liquid drop, especially demineralized water, on pad 32.

According to a second embodiment of the method for manufacturing the self-assembly pad, the pad is formed at the top of a protrusion having its sides forming a sharp edge with the pad. This enables to benefit, in addition to the wettability difference between the pad and the region surrounding the pad, from an effect of anchoring of the drop to the top of the protrusion to maintain the drop confined on the pad.

Figure 4:
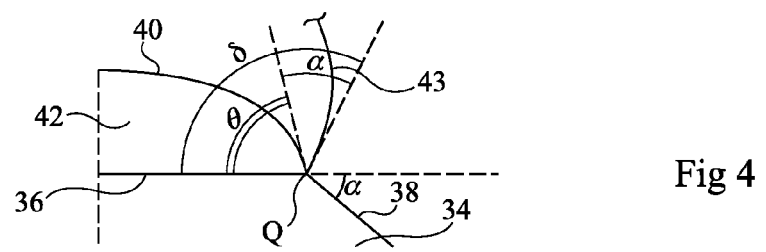
FIG. 4 is a partial simplified cross-section view of a liquid drop resting on a protrusion illustrating the anchoring of the drop to the protrusion.

FIG. 4 illustrates the anchoring effect and shows a protrusion 34 comprising a planar horizontal top 36 and an inclined edge 38. In the cross-section plane of FIG. 4, top 36 and side 38 join at point Q. Side 38 is inclined by an angle α with respect to the horizontal direction. Angle α is equal to 0° in the absence of inclination. FIG. 4 shows the liquid-air interface 40 of a drop 42 when angle α is equal to 0°. At rest, the angle between top 36 and the tangent to interface 40 at point Q is then equal to static contact angle θ. In the absence of inclined edge 38, if liquid is added to drop 42, interface 40 tends to move and to cross point Q, the contact angle remaining constant. In the presence of inclined edge 38, angle δ between top 36 and the tangent to interface 43, for which drop 42 crosses point Q, is equal to the sum of angles θ and α. All occurs as if drop 42 remained bonded to top 36 of protrusion 34.

FIGS. 5A to 5G illustrate the structures obtained at successive steps of the second embodiment of a method for manufacturing according to the present invention pads of a support 43 intended for the implementation of a self-assembly method. A single pad is shown in FIGS. 5A to 5G. It should be clear that the second embodiment of the manufacturing method according to the present invention may be implemented to simultaneously form several pads.

Figure 5A:
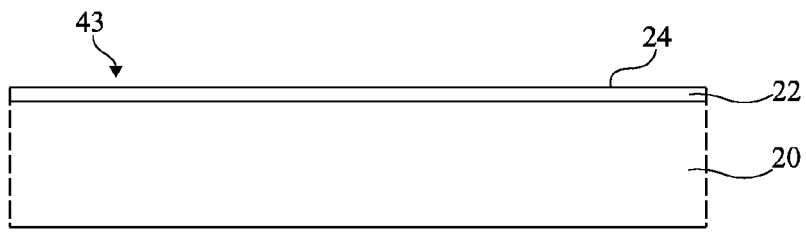
FIGS. 5A to 5G are partial simplified cross-section views of the structures obtained at successive steps of a second embodiment of a method for manufacturing according to the present invention a pad intended for the implementation of a self-assembly method.
Figure 5B:
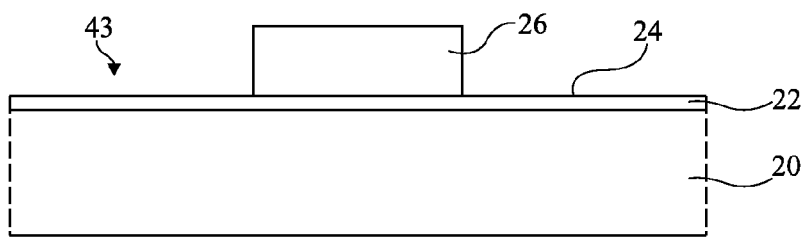

FIGS. 5A and 5B are identical to previously-described FIGS. 3A and 3B.

Figure 5C:
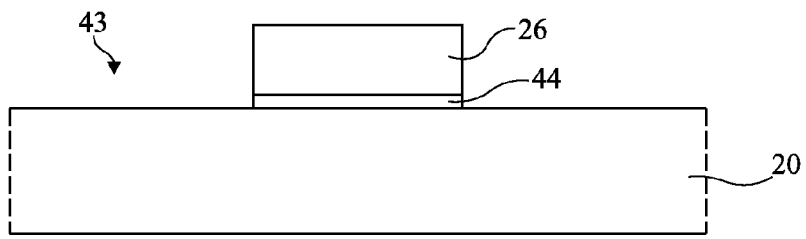

FIG. 5C shows the structure obtained after a step of etching of silicon oxide layer 22 around resin portion 26. A portion 44 of silicon oxide layer 22 then remains under resin portion 26. The etching may be a reactive ion etching or RIE. The etch gas may be hydrofluoric acid (HF) or ammonium fluoride ($NH_4F$). Silicon substrate 20 may behave as an etch stop layer.

Figure 5D:
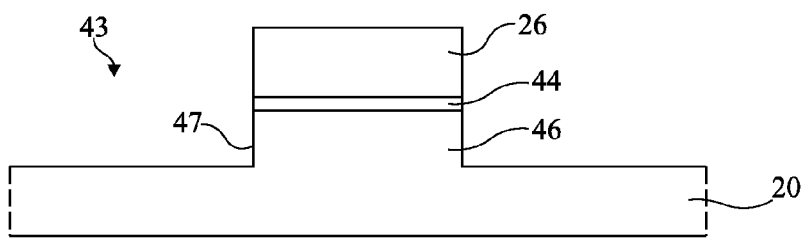

FIG. 5D shows the structure obtained after a step of etching of substrate 20 to form a protrusion 46 which prolongs resin portion 26 and silicon oxide portion 44. The height of protrusion 46 may range from 500 nm to 80 μm. Protrusion 46 comprises inclined sides 47 substantially perpendicular to the upper surface of portion 44. As a variation, sides 47 may be inclined with respect to the support surface of portion 44 by an angle α (see FIG. 4) ranging between 0° and 90°, preferably between 45° and 90°.

The etching is an anisotropic etching, resin portion 26 behaving as an etch mask. It may be a deep reactive ion etching or DRIE. The etch gas may be sulfur hexafluoride ($SF_6$). In this case, the height of protrusion 46 is preferably smaller than a few micrometers. The etching may be performed according to the Bosch method. In this case, the height of protrusion 46 is preferably greater than a few micrometers.

The Bosch method comprises exposing support 43 to an alternation of an etch plasma and of a passivation plasma at ambient temperature. The etch plasma is formed from sulfur hexafluoride ($SF_6$). Fluorinated radicals form and react with the silicon to create volatile species, especially tetrafluorosilane ($SiF_4$). The passivation plasma is formed from octafluorobutene ($C_4F_8$), hexafluoroethane ($C_2F_6$), carbon tetrafluoride ($CF_4$), and/or trifluoromethane ($CHF_3$). The etch plasma isotropically etches the silicon, with resin portion 26 behaving as an etch mask. After an exposure of support 43 to the etch plasma, support 43 is exposed to the passivation plasma, which causes the deposition of a protection layer on the sides of the etched area and on the bottom of the etched area by deposition of a layer of a fluorocarbon polymer. The thickness of the passivation deposition is conditioned by the parameters of the passivation plasma. The next etch step destroys the passivation layer at the bottom of the etched area with the ion bombarding. The silicon which is not protected by the passivation layer is then etched in this same step by the fluorinated radicals coming from the etch plasma. By increasing the number of alternations of the etch and passivation steps, a deep anisotropic etching can then be obtained.

As an example, gases $SF_6$, $C_4F_8$, $C_2F_6$, $CF_4$, and/or $CHF_3$ may be introduced into a reactor chamber. A plasma is then formed at ambient temperature, for example, at approximately 20° C., by application of an adapted radio frequency current to the chamber. The pressure in the reactor chamber for example ranges from 10 to 100 Pa. The partial pressure of $SF_6$ etch gas is, for example, on the order of 20 mTorr (2.67 Pa). The etch plasma based on $SF_6$ gas and the passivation plasma based on $C_4F_8$, $C_2F_6$, $CF_4$, and/or $CHF_3$ gases may be formed in an inductive coupling plasma reactor.

Figure 5E:
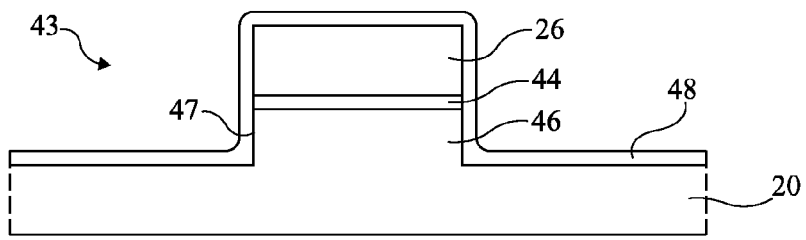

FIG. 5E shows the structure obtained after the deposition of a layer 48 of low wettability over the entire structure shown in FIG. 5D. In particular, layer 48 covers sides 47 of protrusion 46. The deposition of layer 48 may be performed as described previously in relation with FIG. 3C for the deposition of layer 28. The thickness of layer 48 for example ranges between 10 nm and 300 nm. Layer 48 is based on fluorinated compounds. Preferably, layer 48 is based on fluorocarbon compounds. As an example, layer 48 is based on fluorocarbon compounds of $C_xF_y$ type, where x and y are real numbers, with x ranging from 1 to 5 and y ranging from 1 to 8.

Figure 5F:
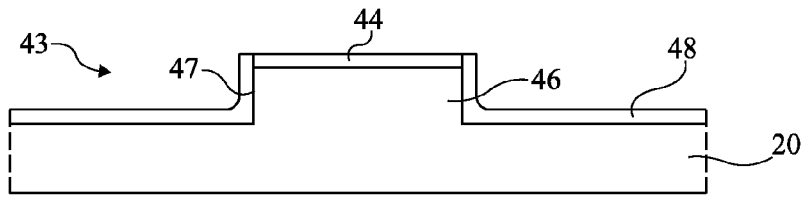

FIG. 5F shows the structure obtained after a step of removal of resin portion 26 to expose portion 44. This may be done as previously described in relation with FIG. 3D by placing the structure shown at step 5E in a bath of a solvent and by applying ultrasounds to support 43 during its dipping in the bath.

Figure 5G:
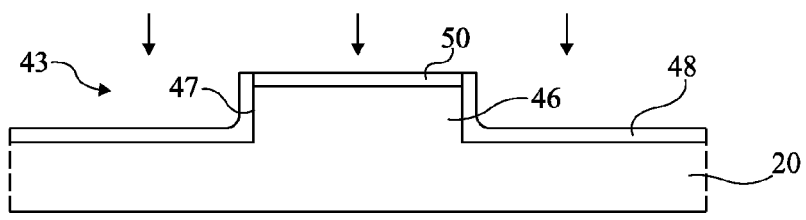

FIG. 5G shows the structure obtained after a processing causing an increase in the wettability of the exposed portion 44 to form pad 50 intended for the implementation of a self-assembly method. This may be done as previously described in relation with FIG. 3E by exposing the entire structure shown in FIG. 5F to an ultraviolet radiation in the presence of ozone.

The angle of contact of a drop of a liquid, for example, demineralized water, on pad 50 is smaller than or equal to 15°, preferably smaller than or equal to 10°, and preferably still smaller than or equal to 5°. Further, the angle between sides 47 covered with layer 48 of low wettability and pad 50 enables to benefit from the previously-described anchoring effect. The confinement of a liquid drop on pad 50 is thus improved.

The manufacturing method according to the present invention is particularly suitable in the case where the bonding of the integrated circuit to support 19, 43, which is performed after the self-assembly, is performed by molecular bonding. Indeed, for this type of bonding, surfaces with an adapted roughness must be provided. The previously-described manufacturing method examples provide pads 32, 50 having an RMS roughness for example ranging between 0.2 nm and 0.5 nm (measured on a 1-$\mu m^2$ measurement surface area), that is, adapted to a molecular bonding method. Further, since portion 50 has a high wettability, it is adapted to the performing of a hydrophilic molecular bonding.

Specific embodiments of the present invention have been described. Various alterations, modifications, and improvements will occur to those skilled in the art. In particular, in the previously-described embodiments, substrate 20 is made of a semiconductor material, for example, silicon. As a variation, substrate 20 may be a glass substrate or a metal substrate. In this case, there may be no insulating layer 22. Substrate 20 may be a composite substrate, comprising at its surface elements of a semiconductor material, elements of a metallic material, and/or elements of an insulating material. In this case, insulating layer 22 may only cover the semiconductor material elements.

The invention claimed is:

1. A method for manufacturing at least one assembly pad on a support intended for the implementation of a method of self-assembly of at least one element (10) on the support, the manufacturing method comprising the successive steps of:
   (a) forming, on the support, a layer of at least one fluorinated material around the location of the assembly pad; the layer having a thickness higher than 10 nm; and
   (b) submitting the layer and the location to an ultraviolet processing in the presence of ozone to form the assembly pad at said location surrounded with said layer, a drop of demineralized water having a static contact angle on the assembly pad lower or equal to 15°, the demineralized water drop having, after step b), a static contact angle higher or equal to 100°.

2. The method of claim 1, wherein the fluorinated material is a fluorocarbon material.

3. The method of claim 1, wherein step (a) comprises exposing the support to a plasma based on octafluorobutene, hexafluoroethane, carbon tetrafluoride, and/or trifluoromethane.

4. The method of claim 1, further comprising the steps of:
   (c) forming a resin portion on the support at said location before step (a); and
   (d) removing the resin portion before step (b).

5. The method of claim 4, further comprising, after step (c) and before step (a), a step of etching the support to form a protrusion under the resin portion (26).

6. The method of claim 1, wherein the support comprises a semiconductor material substrate having the fluorinated material layer formed thereon, the method further comprising a step of forming an oxide layer of the semiconductor material on the substrate before step (a).

7. The method of claim 1, further comprising the steps of:
   (e) depositing a drop of a liquid on the assembly pad; and
   (f) bringing the element in contact with the drop, whereby the element is self-assembled with respect to the support.

8. The method of claim 7, wherein the element is an integrated circuit chip.

9. The method of claim 7, further comprising the steps of:
(g) drying the drop; and
(h) bonding the element to the support.

10. The method of claim 9, wherein step (h) comprises a step of molecular bonding of the element to the assembly pad.

11. A support intended for the implementation of a method of self-assembly of at least one element on the support, comprising:
- at least one assembly pad, a liquid drop having a static contact angle on the assembly pad smaller than or equal to 15°; and
- a layer at least one fluorinated material around the assembly pad, the liquid drop having a static contact angle on the layer greater than or equal to 100°.

12. The support of claim 11, wherein the liquid drop has a static contact angle on the assembly pad smaller than or equal to 10° and has a static contact angle on the layer greater than or equal to 110°.

13. The support of claim 11, wherein the fluorinated material is a fluorocarbon material.

14. The support of claim 11, further comprising a protrusion comprising sides and a top, the assembly pad being on the top and the layer covering the sides.

15. The support of claim 14, wherein the sides are inclined by more than 45° with respect to the top.

16. The support of claim 11, further comprising a substrate, the assembly pad and the layer being formed on the substrate, the substrate being made of a semiconductor material, the assembly pad comprising an oxide of the semiconductor material.

* * * * *